United States Patent
Heymann

(10) Patent No.: US 10,211,124 B2
(45) Date of Patent: Feb. 19, 2019

(54) HEAT SPREADERS WITH STAGGERED FINS

(71) Applicant: INTEL CORPORATION, Santa Clara, CA (US)

(72) Inventor: Douglas Heymann, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/594,213

(22) Filed: May 12, 2017

(65) Prior Publication Data

US 2018/0331015 A1    Nov. 15, 2018

(51) Int. Cl.
| | | |
|---|---|---|
| *H01L 23/40* | (2006.01) | |
| *H01L 23/467* | (2006.01) | |
| *H01L 23/433* | (2006.01) | |
| *F28F 21/08* | (2006.01) | |
| *H05K 1/18* | (2006.01) | |
| *H05K 1/02* | (2006.01) | |
| *H05K 7/20* | (2006.01) | |
| *G06F 1/20* | (2006.01) | |

(52) U.S. Cl.
CPC ........ *H01L 23/4093* (2013.01); *F28F 21/084* (2013.01); *H01L 23/433* (2013.01); *H01L 23/467* (2013.01); *H05K 1/0203* (2013.01); *H05K 1/181* (2013.01); *G06F 1/20* (2013.01); *H05K 7/20409* (2013.01); *H05K 7/20727* (2013.01); *H05K 2201/10159* (2013.01); *H05K 2201/10522* (2013.01); *H05K 2201/10545* (2013.01)

(58) Field of Classification Search
CPC .... H05K 1/02–1/0203; H05K 1/0209–1/0212; H05K 7/20509; H05K 7/2039; H05K 7/20545; H05K 7/20445; H05K 7/209; H05K 7/20454; H05K 2201/066; H01L 23/3672; G11C 5/04

USPC ......... 361/708–715, 719–723; 257/706, 717; 174/252

See application file for complete search history.

(56) References Cited

U.S. PATENT DOCUMENTS

| | | | | |
|---|---|---|---|---|
| 5,444,304 | A * | 8/1995 | Hara | H01L 23/3675 257/722 |
| 6,119,765 | A * | 9/2000 | Lee | G11C 5/00 165/185 |
| 7,233,501 | B1 * | 6/2007 | Ingalz | H01L 23/367 257/E23.102 |

(Continued)

*Primary Examiner* — Dion Ferguson
*Assistant Examiner* — Amir A Jalali
(74) *Attorney, Agent, or Firm* — Green, Howard & Mughal

(57) ABSTRACT

An apparatus is provided which comprises: a first heat spreader surface, a second heat spreader surface, and a plurality of heat spreading fins on, and extending substantially perpendicularly from, the first and second heat spreader surfaces, wherein the plurality of heat spreading fins are arranged substantially parallel to one another in a plurality of substantially linear columns, wherein the columns of heat spreading fins are separated by gap regions wider than the heat spreading fins, and wherein the columns of heat spreading fins on the first heat spreader surface are sited to line up with gap regions between columns of heat spreading fins on the second heat spreader surface when the first and second heat spreader surfaces are aligned. Other embodiments are also disclosed and claimed.

7 Claims, 5 Drawing Sheets

(56) References Cited

U.S. PATENT DOCUMENTS

| | | | | |
|---|---|---|---|---|
| 7,612,446 B2* | 11/2009 | Dang | ............... | H01L 23/3672 165/80.3 |
| 8,081,474 B1* | 12/2011 | Zohni | ............... | H01L 23/367 257/719 |
| 8,599,557 B2* | 12/2013 | Peterson | ............... | G06F 1/20 165/104.21 |
| 9,158,349 B2* | 10/2015 | Dean | ............... | G06F 1/20 |
| 2006/0221578 A1* | 10/2006 | Foster, Sr. | ............... | G06F 1/184 361/721 |
| 2007/0195489 A1* | 8/2007 | Lai | ............... | G11O 5/143 361/600 |
| 2007/0263360 A1* | 11/2007 | Lai | ............... | H01L 23/4093 361/719 |
| 2008/0011453 A1* | 1/2008 | Liang | ............... | H05K 7/2049 165/80.3 |
| 2008/0074848 A1* | 3/2008 | Park | ............... | H01L 23/4093 361/718 |
| 2008/0123300 A1* | 5/2008 | Tian | ............... | G11O 5/04 361/721 |
| 2009/0103269 A1* | 4/2009 | Liu | ............... | G06F 1/20 361/719 |
| 2009/0116195 A1* | 5/2009 | Yang | ............... | H01L 23/3675 361/709 |
| 2009/0257197 A1* | 10/2009 | Yang | ............... | H01L 23/4093 361/720 |
| 2009/0268408 A1* | 10/2009 | Liu | ............... | G06F 1/20 361/710 |
| 2009/0316352 A1* | 12/2009 | Zhu | ............... | G11O 5/04 361/679.54 |
| 2011/0032672 A1* | 2/2011 | Artman | ............... | G06F 1/20 361/679.47 |
| 2011/0310565 A1* | 12/2011 | He | ............... | G06F 1/20 361/715 |
| 2012/0279761 A1* | 11/2012 | Hori | ............... | H01L 21/4878 174/252 |

* cited by examiner

HEAT SPREADERS WITH STAGGERED FINS

BACKGROUND

Computing platforms, such as high performance or cloud computing platforms, for example, may include integrated circuit devices that generate enough heat when operating to require an active or passive thermal solution. In addition to the processor(s), server or data center platforms may have multiple memory modules that generate significant amounts of heat when operating. Typically, memory modules, such as dynamic random access memory (DRAM) devices, may be mounted on a printed circuit board as part of a dual in-line memory module (DIMM). A platform motherboard may include several DIMM slots in very close proximity. If the distance between DIMM slots decreases, to accommodate other components on the motherboard for example, problems could arise in effectively dissipating heat generated by the DIMMs. Therefore, there is a need for thermal solutions that make efficient use of narrow airgaps between modules, such as DIMMs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Heat spreaders with staggered fins are generally presented. In this regard, embodiments of the present disclosure enable more efficient use of system volume for locating heat spreading surfaces. One skilled in the art would appreciate that these staggered fins may enable reductions in pitch between module slots. Additionally, in some embodiments, these staggered fins, when positioned in line with a fan, may provide more efficient use of oncoming airflow.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under, " and the like in the description and in the claims, if any, are used for descriptive purposes and not necessarily for describing permanent relative positions.

Figure 1:
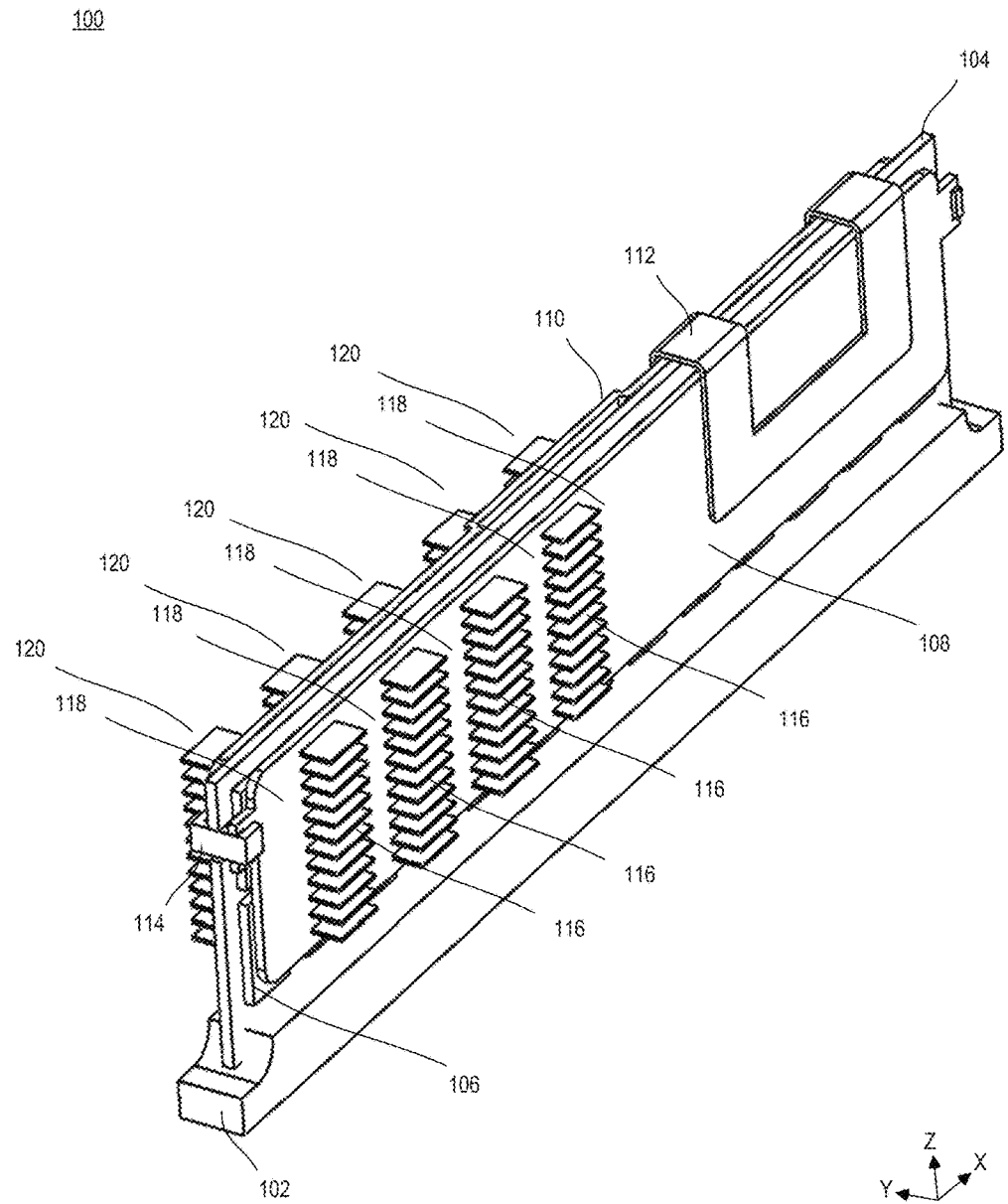
FIG. 1 illustrates a 3D view of a module including heat spreaders with staggered fins, according to some embodiments.

FIG. 1 illustrates a 3D view of a module including heat spreaders with staggered fins, according to some embodiments. As shown, module 100 includes slot 102, printed circuit board 104, integrated circuit device 106, heat spreader surfaces 108 and 110, retention clips 112 and 114, heat spreading fin columns 116, gap regions 118, and heat spreading fin columns 120.

Slot 102 may represent a DIMM slot or another type of slot or socket to electrically couple components of module 100 with circuitry on a motherboard (not shown). Slot 102 may include gold or other conductive contacts that electrically couple with contacts near an edge of printed circuit board 104 of module 100. While shown as holding module 100 in a relatively upright orientation, slot 102 may hold module 100 at an angle in some embodiments.

Printed circuit board 104 may include multiple laminated routing layers and may include active and passive components, including multiple integrated circuit devices 106. In some embodiments, integrated circuit device 106 may represent a controller or memory device, such as double data rate (DDR) DRAM devices or other types of memory device. In some embodiments, module 100 may include 8 memory chips and one controller chip per side, however any number of memory chips and/or controllers may be used in other embodiments.

Heat spreader surfaces 108 and 110 may be thermally coupled with integrated circuit devices 106 through direct contact or indirectly through a thermal grease or other thermally conductive substance. In some embodiments, heat spreader surfaces 108 and 110 are aluminum or some other metal and include heat spreading fins that extend outwardly from portions of the surfaces. While shown as extending substantially perpendicular from heat spreader surfaces 108 and 110, in some embodiments heat spreading fins may extend from the surfaces at other angles.

Retention clips 112 and 114 may be metal springs or other material that hold heat spreader surfaces 108 and 110 together in alignment. Heat spreader surfaces 108 and 110 may have regions without heat spreading fins specifically designed to accept retention clips 112 and 114. While shown as being two distinct components, in some embodiments, heat spreader surfaces 108 and 110 may be portions of one continuous component.

Heat spreading fin columns 116 on heat spreader surface 108 may include linear arrangements of substantially matching heat spreading fins. In some embodiments, heat spreading fin columns 116 include heat spreading fins substantially parallel to one another. In some embodiments, while fins in one heat spreading fin column 116 may be parallel to other fins in that same column, they may be angled slightly such that they are not parallel with fins in other heat spreading fin columns 116.

In some embodiments, heat spreading fin columns 116 include heat spreading fins evenly spaced on the y-axis. In some embodiments, fins in one or more heat spreading fin columns 116 may not be spaced evenly on the y-axis. Also, one or more heat spreading fin column 116 may include heat spreading fins at different heights on the y-axis compared to other heat spreading fin columns 116.

Heat spreading fin columns 116 may be separated by gap regions 118. In some embodiments, as can be seen in more detail in subsequent figures hereinafter, gap regions 118 may line up with, and be at least slightly wider than, heat spreading fin columns 120 of heat spreader surface 110. In some embodiments, heat spreading fin columns 116 include fins not only at different locations than heat spreading fin columns 120 on the x-axis, but also at different locations on the z-axis, for example as shown more clearly in FIG. 4.

While shown as including four heat spreading fin columns 116 and five heat spreading fin columns 120, in some embodiments different quantities of heat spreading fin columns may be include. Also, while shown as including twelve heat spreading fins in each column, in some embodiments different or varying numbers of fins may be included in the columns.

Figure 2:
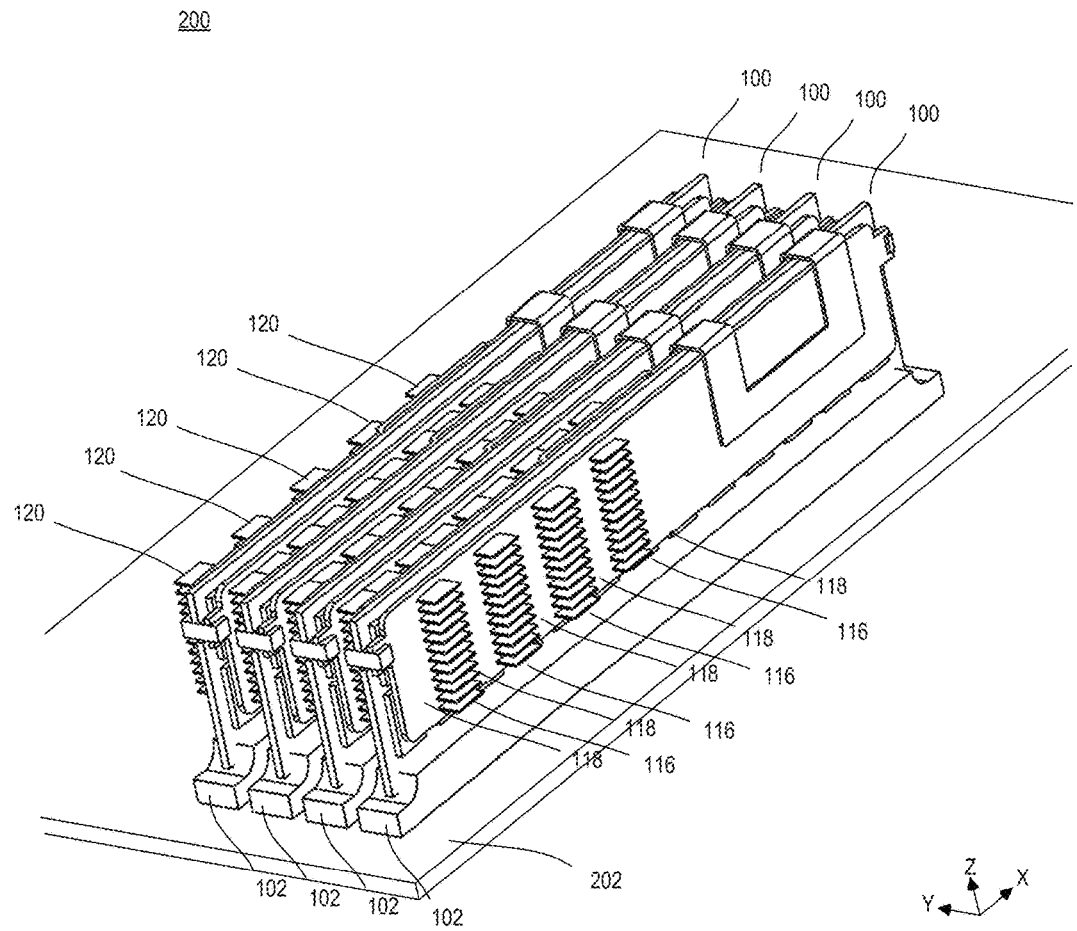
FIG. 2 illustrates a 3D view of a platform having multiple modules including heat spreaders with staggered fins, according to some embodiments.

FIG. 2 illustrates a 3D view of a platform having multiple modules including heat spreaders with staggered fins, according to some embodiments. As shown, platform 200 includes motherboard 202 and multiple modules 100 in close proximity to one another. While shown as including four modules 100, six, eight or any number of modules may be included in various embodiments. In some embodiments, motherboard 202 is a multi-layer system board, such as for a server or data center, that includes many other system components not shown.

In some embodiments, the depth (in the y-dimension) of the heat spreading fins included in heat spreading fin columns 116 and 120 are chosen based on a pitch spacing of slots 102 so as to extend nearly to an adjacent heat spreader surface. In one example embodiment, where slots 102 are sited at a pitch spacing of 0.3 inches, heat spreading fin columns 116 and 120 may have a depth of between about 3 and 4 millimeters, for example 3.66 mm. Also, in some embodiments, heat spreading fin columns 116 and 120 may have a width (in the x-dimension) of between about 6 and 7 millimeters, for example 6.5 mm. While shown as each including fins of matching dimensions, in some embodiments, some of heat spreading fin columns 116 and 120 may include fins of different dimensions, for example different widths. For example, one of heat spreading fin columns 116 may include fins having a width of about 6.5 mm, while another of heat spreading fin columns 116 may include fins having a width of about 10 mm.

Gap regions 118 may be designed to be adjacent to and to have a greater width than heat spreading fin columns 120. In this way, it may be possible to insert or remove one of modules 100 into or from a slot 102 by moving the module 100 down or up (in the z-dimension) even when the remaining slots 102 are populated with modules 100.

Figure 3:
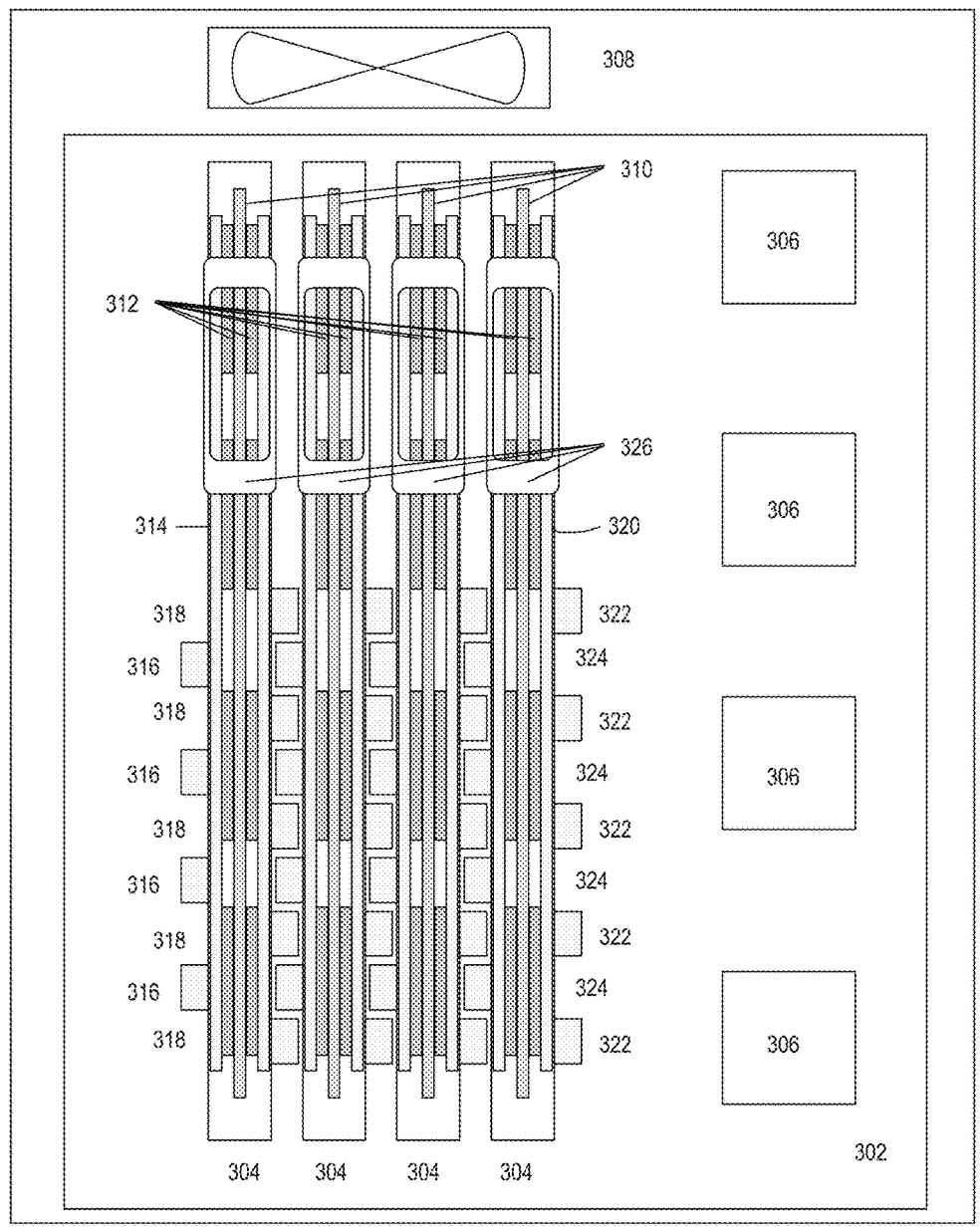
FIG. 3 illustrates an overhead view of a platform having multiple modules including heat spreaders with staggered fins, according to some embodiments.

FIG. 3 illustrates an overhead view of a platform having multiple modules including heat spreaders with staggered fins, according to some embodiments. As shown, platform 300 includes motherboard 302, DIMM slots 304, integrated circuit devices 306, fan 308, DIMMs 310, memory devices 312, heat spreader surface 314, heat spreading fins 316, gap regions 318, heat spreader surface 320, heat spreading fins 322, gap regions 324, and retention clips 326. Platform 300 may represent a desktop, laptop, server, data center or other type of computing platform.

Motherboard 302 may include any number of DIMM slots 304, integrated circuit devices 306, which may represent processors or controllers for example, as well as other components not shown. Fan 308 may direct airflow parallel to DIMM slots 304 as part of a thermal solution. When operating, fan 308 may generate airflow in the spaces between DIMM slots 304 and across heat spreading fins 316 and 322, which extend nearly the full extent of the airgaps between DIMM slots 304 due to the staggered design of heat spreading fins. In this way, gap regions 324 allow heat spreading fins 316 to extend nearly into contact with heat spreader surface 320. Similarly, gap regions 318 allow heat spreading fins 322 to extend nearly into contact with heat spreader surface 314.

When DIMMs 310 are operating, heat from memory devices 312 may be spread across heat spreader surfaces 314 and 320 and into heat spreading fins 316 and 322. Retention clips 326 may hold heat spreader surfaces 314 and 320 in contact with memory devices 312.

Figure 4:
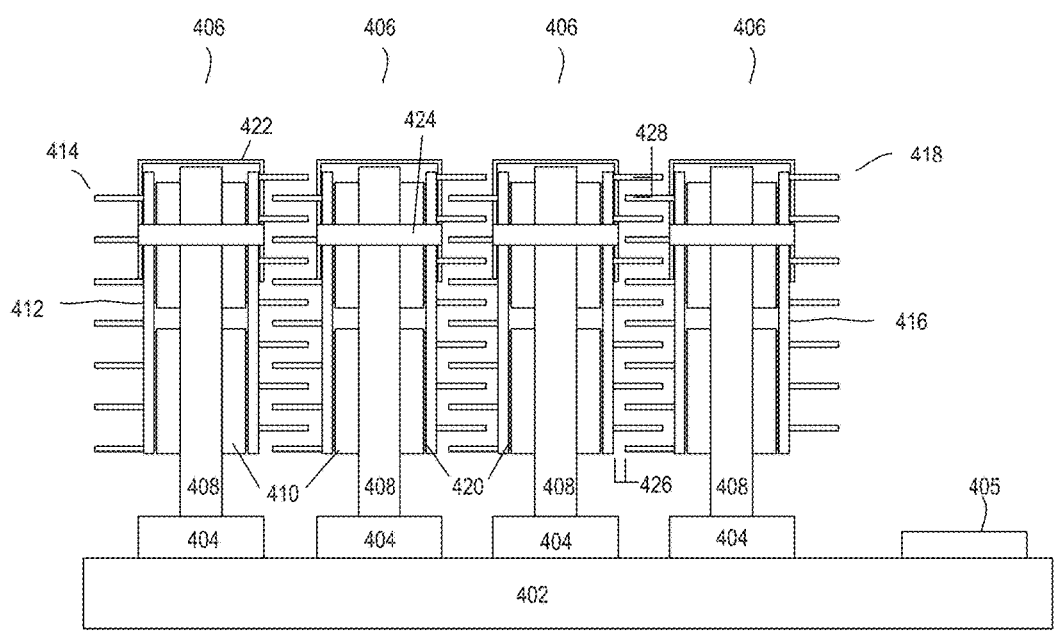
FIG. 4 illustrates a side view of a platform having multiple modules including heat spreaders with staggered fins, in accordance with some embodiments.

FIG. 4 illustrates a side view of a platform having multiple modules including heat spreaders with staggered fins, in accordance with some embodiments. As shown, platform 400 includes motherboard 402, DIMM slots 404, integrated circuit device 405, DIMMs 406, printed circuit board 408, memory devices 410, heat spreader surface 412, heat spreading fins 414, heat spreader surface 416, heat spreading fins 418, thermal grease 420, retention clips 422 and 424, separation distance 426, and height differential 428. Platform 400 may represent a desktop, laptop, server, data center or other type of computing platform.

Motherboard 402 may include any number of DIMM slots 404, integrated circuit devices 405, which may represent processors or controllers for example, as well as other components not shown. While not drawn to scale, heat spreading fins 414 and 418 may span a substantial majority of the distance between DIMM slots 404 and extend a relatively short separation distance 426 from contacting a heat spreader surface of an adjacent DIMM 406. In some embodiments, separation distance 426 is less than a millimeter.

In some embodiments, when heat spreader surfaces 412 and 416 are aligned on opposite sides of DIMM 406, heat spreading fins 414 and 418 are staggered in height by height differential 428. In some embodiments, height differential 428 is a uniform distance while in other embodiments height differential 428 varies in different regions. In some embodiments, height differential 428 may be about half the spacing between neighboring heat spreading fins 418.

Thermal grease 420 may thermally couple heat spreader surfaces 412 and 416 with memory devices 410 and may have some adhesive properties that may, along with retention clips 422 and 424, hold heat spreader surfaces 412 and 416 in contact with memory devices 410.

Figure 5:
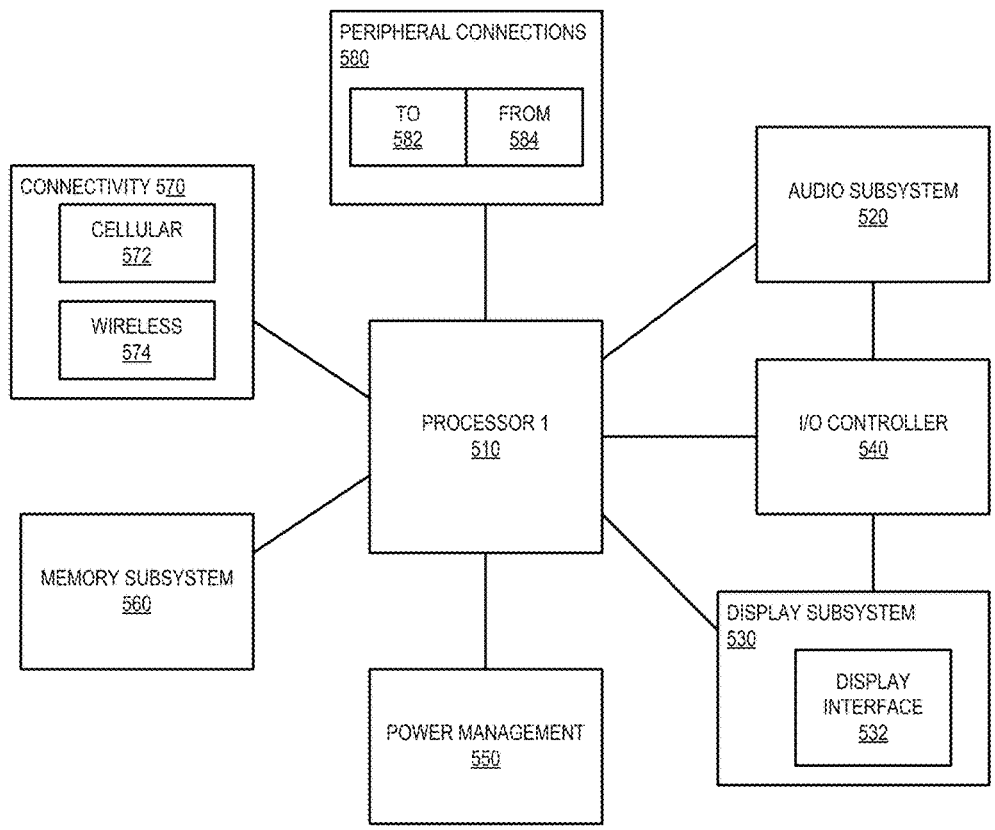
FIG. 5 illustrates a smart device or a computer system or a SoC (System-on-Chip) which includes heat spreaders with staggered fins, according to some embodiments.

FIG. 5 illustrates a smart device or a computer system or a SoC (System-on-Chip) 500 which includes heat spreaders with staggered fins, according to some embodiments. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500. In some embodiments, one or more components of computing device 500, for example memory subsystem 560, include heat spreaders with staggered fins as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 500 includes a first processor 510. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Connectivity 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a first heat spreader surface; a second heat spreader surface; and a plurality of heat spreading fins on, and extending substantially perpendicularly from, the first and second heat spreader surfaces, wherein the plurality of heat spreading fins are arranged substantially parallel to one another in a plurality of substantially linear columns, wherein the columns of heat spreading fins are separated by gap regions wider than the heat spreading fins, and wherein the columns of heat spreading fins on the first heat spreader surface are sited to line up with gap regions between columns of heat spreading fins on the second heat spreader surface when the first and second heat spreader surfaces are aligned.

In some embodiments, the heat spreading fins comprise aluminum. Some embodiments also include substantial portions of the first and second heat spreader surfaces void of heat spreading fins to accept an attachment mechanism. In some embodiments, the heat spreading fins on the first heat spreader surface comprise about five columns. In some embodiments, the heat spreading fins comprise about twelve fins in one of more of the columns. In some embodiments, the heat spreading fins comprise a width of between about 6 and 7 millimeters. In some embodiments, the heat spreading fins comprise a depth of between about 3 and 4 millimeters. In some embodiments, the heat spreading fins on the first heat spreader surface are sited at different heights from the heat spreading fins on the second heat spreader surface when the first and second heat spreader surfaces are aligned.

In another example, an apparatus is provided comprising: a printed circuit board having a first side and a second side; a first plurality of integrated circuit devices coupled to the first side of the printed circuit board; a second plurality of integrated circuit devices coupled to the second side of the printed circuit board; a first heat spreader surface thermally coupled with the first plurality of integrated circuit devices; a second heat spreader surface thermally coupled with the second plurality of integrated circuit devices, wherein the first and second heat spreader surfaces are aligned with each other; and a plurality of heat spreading fins on, and extending substantially perpendicularly from, the first and second heat spreader surfaces, wherein the plurality of heat spreading fins are arranged substantially parallel to one another in a plurality of substantially linear columns, wherein the columns of heat spreading fins are separated by gap regions wider than the heat spreading fins, and wherein the columns of heat spreading fins on the first heat spreader surface are sited to line up with gap regions between columns of heat spreading fins on the second heat spreader surface.

Some embodiments also include thermal grease to thermally couple the first heat spreader with the first plurality of integrated circuit devices. Some embodiments also include a metal clip to fasten the first and second heat spreader surfaces in alignment with each other. In some embodiments, the first plurality of integrated circuit devices comprise memory devices. In some embodiments, the heat spreading fins comprise aluminum. In some embodiments, the heat spreading fins comprise a width of between about 6 and 7 millimeters. In some embodiments, the heat spreading fins comprise a depth of between about 3 and 4 millimeters. In some embodiments, the heat spreading fins on the first heat spreader surface are sited at different heights from the heat spreading fins on the second heat spreader surface.

In another example, a system is provided comprising: a processor; a communication interface; and a plurality of memory modules, the memory modules comprising: a printed circuit board having a first side and a second side; a first plurality of memory devices coupled to the first side of the printed circuit board; a second plurality of memory devices coupled to the second side of the printed circuit board; a first heat spreader surface thermally coupled with the first plurality of memory devices; a second heat spreader surface thermally coupled with the second plurality of memory devices, wherein the first and second heat spreader surfaces are aligned with each other; and a plurality of heat spreading fins on, and extending substantially perpendicularly from, the first and second heat spreader surfaces, wherein the plurality of heat spreading fins are arranged substantially parallel to one another in a plurality of substantially linear columns, wherein the columns of heat spreading fins are separated by gap regions wider than the heat spreading fins, and wherein the columns of heat spreading fins on the first heat spreader surface are sited to line up with gap regions between columns of heat spreading fins on the second heat spreader surface.

In some embodiments, the plurality of memory modules comprises four parallel modules. The system of claim 18, further comprising a spacing pitch between the memory modules of about 0.3 inches. Some embodiments also include a fan configured to direct air across the heat spreading fins. In some embodiments, the heat spreading fins on a first heat spreader surface of a first memory module extend to within a relatively small distance of a second heat spreader surface of a second memory module. In some embodiments, the heat spreading fins comprise a width of between about 6 and 7 millimeters. In some embodiments, the heat spreading fins comprise a depth of between about 3 and 4 millimeters. In some embodiments, the heat spreading fins on the first heat spreader surface are sited at different heights from the heat spreading fins on the second heat spreader surface.

In another example, a Dual Inline Memory Module (DIMM) is provided comprising: a printed circuit board having a first side and a second side; a first plurality of memory devices coupled to the first side of the printed circuit board; a second plurality of memory devices coupled to the second side of the printed circuit board; a first heat spreader surface thermally coupled with the first plurality of memory devices; a second heat spreader surface thermally coupled with the second plurality of memory devices, wherein the first and second heat spreader surfaces are aligned with each other; and a plurality of heat spreading means on, and extending substantially perpendicularly from, the first and second heat spreader surfaces, wherein the plurality of heat spreading means are arranged substantially parallel to one another in a plurality of substantially linear columns, wherein the columns of heat spreading means are separated by gap regions wider than the heat spreading means, and wherein the columns of heat spreading means on the first heat spreader surface are sited to line up with gap regions between columns of heat spreading means on the second heat spreader surface.

Some embodiments also include thermal grease to thermally couple the first heat spreader with the first plurality of memory devices. Some embodiments also include a metal retention means to fasten the first and second heat spreader surfaces in alignment with each other. In some embodiments, the heat spreading means comprise aluminum. In some embodiments, the heat spreading means comprise a width of between about 6 and 7 millimeters. In some embodiments, the heat spreading means comprise a depth of between about 3 and 4 millimeters. In some embodiments, the heat spreading means on the first heat spreader surface are sited at different heights from the heat spreading means on the second heat spreader surface.

In another example, a system is provided comprising: a processor; a communication interface; and a plurality of Dual Inline Memory Modules (DIMMs), the DIMMs comprising: a printed circuit board having a first side and a second side; a first plurality of memory devices coupled to the first side of the printed circuit board; a second plurality of memory devices coupled to the second side of the printed circuit board; a first heat spreader surface thermally coupled with the first plurality of memory devices; a second heat spreader surface thermally coupled with the second plurality of memory devices, wherein the first and second heat spreader surfaces are aligned with each other; and a plurality of heat spreading means on, and extending substantially perpendicularly from, the first and second heat spreader surfaces, wherein the plurality of heat spreading means are arranged substantially parallel to one another in a plurality of substantially linear columns, wherein the columns of heat spreading means are separated by gap regions wider than the heat spreading means, and wherein the columns of heat spreading means on the first heat spreader surface are sited to line up with gap regions between columns of heat spreading means on the second heat spreader surface.

In some embodiments, the plurality of DIMMs comprise four parallel slots. Some embodiments also include a spacing pitch between the DIMMs of about 0.3 inches. Some embodiments also include an air circulation means configured to direct air across the heat spreading means. In some embodiments, the heat spreading means on a first heat spreader surface of a first memory module extend to within a relatively small distance of a second heat spreader surface of a second memory module. In some embodiments, the heat spreading means comprise a width of between about 6 and 7 millimeters. In some embodiments, the heat spreading means comprise a depth of between about 3 and 4 millimeters. In some embodiments, the heat spreading means on the first heat spreader surface are sited at different heights from the heat spreading means on the second heat spreader surface.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. A system comprising:
a processor;
a communication interface; and
a plurality of memory modules, the memory modules comprising:
   a printed circuit board having a first side and a second side;
   a first plurality of memory devices coupled to the first side of the printed circuit board;
   a second plurality of memory devices coupled to the second side of the printed circuit board;
   a first heat spreader surface thermally coupled with the first plurality of memory devices;
   a second heat spreader surface thermally coupled with the second plurality of memory devices, wherein the first and second heat spreader surfaces are aligned with each other;
   a plurality of heat spreading fins on, and extending perpendicularly from, the first and second heat spreader surfaces, wherein the plurality of heat spreading fins are arranged parallel to one another in a plurality of linear columns, wherein the columns of heat spreading fins are separated by gap regions wider than the heat spreading fins, and wherein the columns of heat spreading fins on the first heat spreader surface are sited to line up with gap regions between the columns of heat spreading fins on the second heat spreader surface, wherein the heat spreading fins on a first heat spreader surface of a first memory module extend to within less than one millimeter of a second heat spreader surface of a second memory module; and
   a void region on the first and second heat spreader surfaces void of the heat spreading fins, wherein the void region extends vertically the full height of the first and second heat spreader surfaces and the void region extends horizontally to a side of the first and second heat spreader surfaces.

2. The system of claim 1, wherein the plurality of memory modules comprises four parallel modules.

3. The system of claim 2, further comprising a spacing pitch between the memory modules of 0.3 inches.

4. The system of claim 2, further comprising a fan configured to direct air across the heat spreading fins.

5. The system of claim 1, wherein the heat spreading fins comprise a width of between 6 and 7 millimeters.

6. The system of claim 1, wherein the heat spreading fins comprise a depth of between 3 and 4 millimeters.

7. The system of claim 1, wherein the heat spreading fins on the first heat spreader surface are sited at different heights from the heat spreading fins on the second heat spreader surface.

* * * * *